(12) United States Patent
Luo et al.

(10) Patent No.: US 10,676,288 B2
(45) Date of Patent: Jun. 9, 2020

(54) FEED DEVICE FOR CRUCIBLE

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Chang Luo, Beijing (CN); Haidong Wu, Beijing (CN); Kening Zheng, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 15/750,464

(22) PCT Filed: Aug. 9, 2017

(86) PCT No.: PCT/CN2017/096536
§ 371 (c)(1),
(2) Date: Feb. 5, 2018

(87) PCT Pub. No.: WO2018/072542
PCT Pub. Date: Apr. 26, 2018

(65) Prior Publication Data
US 2019/0016541 A1    Jan. 17, 2019

(30) Foreign Application Priority Data

Oct. 20, 2016 (CN) .................... 2016 2 1144051 U (51) Int. Cl.
*B65G 47/90* (2006.01)
*B65G 65/23* (2006.01)
(Continued)

(52) U.S. Cl.
CPC .......... *B65G 47/902* (2013.01); *B65G 65/23* (2013.01); *C23C 14/246* (2013.01); *B23Q 7/1426* (2013.01); *C30B 15/10* (2013.01)

(58) Field of Classification Search
CPC ...... B65G 47/90; B65G 47/902; B65G 65/23; B23Q 7/1426; C30B 15/10; C23C 14/246
See application file for complete search history.

(56) References Cited

U.S. PATENT DOCUMENTS 4,428,710 A * 1/1984 Grisebach .................. B25J 9/04
                                                                414/590
5,395,205 A   3/1995 Dugas et al.
(Continued)

FOREIGN PATENT DOCUMENTS

| CN | 102689299 A | 9/2012 |
| CN | 202897519 U | 4/2013 |
| CN | 103303667 A | 9/2013 |

OTHER PUBLICATIONS

Office Action received for Chinese Patent Application No. 201621144051.2, dated Mar. 10, 2017, 1 page of original document only.
(Continued)

*Primary Examiner* — Saul Rodriguez
*Assistant Examiner* — Ashley K Romano
(74) *Attorney, Agent, or Firm* — Womble Bond Dickinson (US) LLP (57) ABSTRACT

This application discloses a feeding device for a crucible, belonging to the field of display technology. The feeding device includes: a base, a robot arm and a bottle holder. The base is movably connected to one end of the robot arm, the one end of the robot arm can move linearly on the base, a motion trajectory of the robot arm is parallel to a lengthwise direction of the crucible. The bottle holder is disposed at the other end of the robot arm and the bottle holder is rotatable (Continued)

at the other end. This application can protect operator's health, improve production efficiency and reduce production costs.

16 Claims, 4 Drawing Sheets

(51) Int. Cl.
    *C23C 14/24*     (2006.01)
    *C30B 15/10*     (2006.01)
    *B23Q 7/14*     (2006.01)

(56) References Cited

U.S. PATENT DOCUMENTS

| | | | | |
|---|---|---|---|---|
| 5,441,042 | A * | 8/1995 | Putman | B25J 9/042 600/102 |
| 2005/0092236 | A1 * | 5/2005 | Bender | C30B 15/02 117/200 |
| 2009/0110522 | A1 * | 4/2009 | Criswell | B65G 67/08 414/398 |
| 2010/0290886 | A1 * | 11/2010 | Hashimoto | B25J 9/042 414/800 |
| 2014/0367224 | A1 * | 12/2014 | Buse | B65B 69/00 198/597 |
| 2016/0136818 | A1 * | 5/2016 | Kitahara | B65G 47/90 414/222.07 |
| 2016/0137428 | A1 * | 5/2016 | Laverdiere | B65G 47/902 414/749.5 |
| 2016/0229051 | A1 * | 8/2016 | Edelmann | B25J 9/044 |
| 2017/0369244 | A1 * | 12/2017 | Battles | B65G 1/137 |
| 2018/0056335 | A1 * | 3/2018 | Ogusu | B07C 5/342 |

OTHER PUBLICATIONS

International Search Report received for PCT Patent Application No. PCT/CN2017/096536, dated Nov. 7, 2017, 6 pages (2 pages Of English Translation and 4 pages of Original Document).

\* cited by examiner

FEED DEVICE FOR CRUCIBLE

RELATED APPLICATION

The present application claims the priority of a Chinese patent application No. 201621144051.2, filed on Oct. 20, 2016, which is incorporated herein by reference in its entirety.

FIELD OF THE DISCLOSURE

The present disclosure relates to the field of display technology, and more particularly to a feeding device for a crucible.

BACKGROUND OF THE DISCLOSURE

In the field of display, the organic material in a display panel, such as some organic material on a substrate, can be formed by evaporating the organic material onto the substrate using a crucible. In the vapor deposition, the organic material to be deposited is first added into the crucible, and then the crucible is heated to sublimate the organic material in the crucible and then the organic material is condensed onto the substrate above the crucible.

Organic material is usually powdered and packed in a narrow-mouth material bottle. When adding the organic material to the crucible, the operator manually picks up the material bottle and starts adding organic material into the crucible from one end of the crucible. During the addition of the organic material, the material bottle is moved along an axial direction of the crucible to fill the entire crucible.

The inventors of the present disclosure have found that at present the following problems exist in current manual organic material adding systems:

First, some of the existing organic materials are toxic, and operators can easily inhale organic materials as they add organic materials to the crucible, greatly damaging the operator's health.

Second, manually adding organic materials by operators is slow in speed, resulting in inefficient production.

Third, because the operators manually add organic materials, organic materials easily sprinkle outside the crucible, resulting in waste, increasing production costs.

SUMMARY OF THE DISCLOSURE

In order to protect the operator's health, increase production efficiency, and reduce production costs, the present disclosure provides a feeding device for a crucible. The feeding device comprising: a base, a robot arm and a bottle holder; the base is movably connected to one end of the robot arm, one end of the robot arm can move linearly on the base, the motion trajectory of the robot arm is parallel to the lengthwise direction of the crucible; the bottle holder is disposed at the other end of the robot arm and the bottle holder is rotatable at the other end.

Optionally, said base is provided with a translational track whose lengthwise direction is parallel to the lengthwise direction of said crucible, one end of the robot arm is located in the translational track and can slide in the translational track.

Optionally, said robot arm includes an upper robot arm, a lower robot arm, and a first rotary member; one end of the lower robot arm is movably connected to the base, and the other end of the lower robot arm is hinged with one end of the upper robot arm via the first rotary member; and the bottle holder is arranged at the other end of the upper robot arm.

Optionally, a slide member and a second rotary member are further included, the slide member is movably connected with the base; one end of the lower robot arm is hinged with the slide member by the second rotary member.

Optionally, said base is provided with a translational track whose lengthwise direction is parallel to the lengthwise direction of said crucible. The slide member is located within the translational track and can slide within the translational track.

Optionally, a third rotary member is further included, the bottle holder is provided at the other end of the upper robot arm by the third rotary member.

Optionally, a first vibration unit is further included; the first vibration unit is fixed at the other end of the robot arm, and the bottle holder is disposed on the first vibration unit.

Optionally, the first vibration unit is a vibrator.

Optionally, a weighing part is further included on which the crucible is placed.

Optionally, the weighing part is provided with a weight display.

Optionally, said weighing part is an electronic scale.

Optionally, the feeding device further comprises a second vibration unit provided in the weighing part and located under the crucible.

Optionally, the weighing part is connected to the base.

Optionally, a fixing mechanism is further included which is provided on the weighing part for fixing the crucible to the weighing part.

The beneficial effects of the technical solution provided by the present disclosure is as follows: since the robot can perform a linear motion parallel to the lengthwise direction of the crucible, the material bottle held on the bottle holder can be moved linearly by the robot arm along the lengthwise direction of the crucible. The bottle holder is rotatable, which can rotate the material bottle. In this way, the material in the material bottle is gradually poured into the crucible, so as to achieve automatic material addition to the crucible, without the operator manually adding material, thereby to protect the operator's health, and increase productivity. Besides, automatic material addition does not sprinkle materials outside the crucible, avoiding waste and reducing production costs.

DETAILED DESCRIPTION OF THE DISCLOSURE

To make the objectives, technical solutions, and advantages of the present disclosure more comprehensible, the embodiments of the present disclosure are further described in detail below with reference to the accompanying drawings.

EMBODIMENTS

Figure 1:
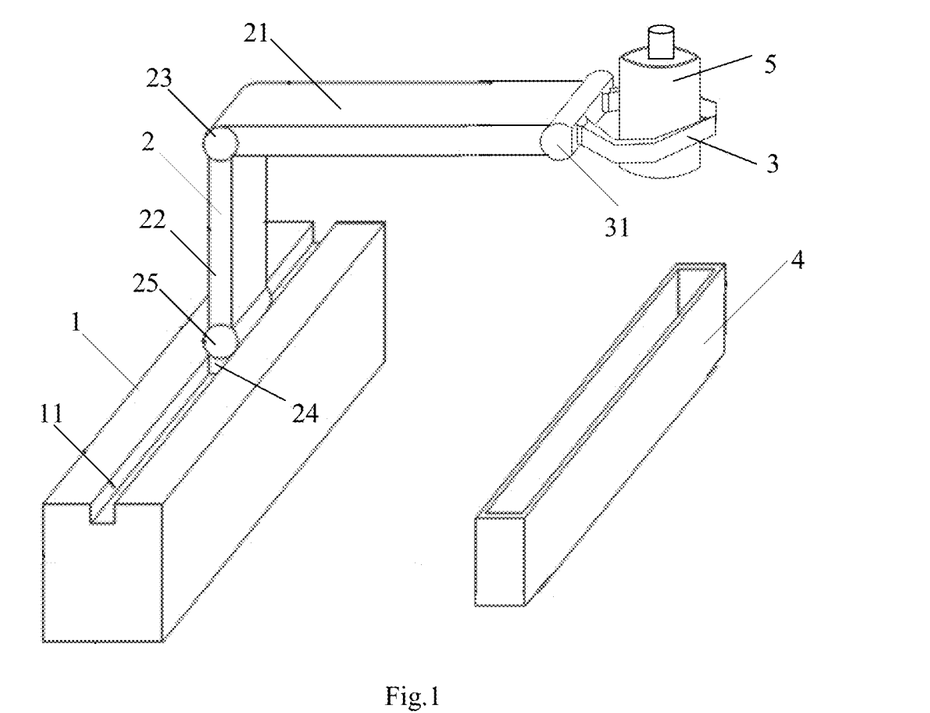
FIG. 1 is a schematic structural view of a feeding device for a crucible according to an embodiment of the present disclosure.

Referring to FIG. 1, an embodiment of the present invention provides a feeding device for a crucible, the feeding device comprising: a base 1, a robot arm 2 and a bottle holder 3.

The base 1 is movably connected to one end of the robot arm 2, one end of the robot arm 2 can move linearly on the base 1, the motion trajectory of the robot arm 2 is parallel to the lengthwise direction of the crucible 4.

The bottle holder 3 is disposed at the other end of the robot arm 2 and the bottle holder 3 is rotatable at the other end.

Referring to FIG. 1, the bottle holder 3 is used for holding the material bottle 5, and the linear crucible 4 is placed directly under the bottle holder 3, that is, directly under the material bottle 5 held by the bottle holder 3.

It should be noted that for convenience of explanation, a description will be made below by taking a linear crucible, that is, a crucible having a substantially linear shape as an example. "Substantially linear" means that the size of the crucible in the lengthwise direction is much larger than its width in the widthwise direction. It should be understood that the same applies to other shapes of crucible types (e.g., round or oval crucibles, etc.). For example, as for circular or oval crucibles, the objects and technical effects of the present application are also achieved as long as the robot arm moves the bottle holder linearly along the long axis or the diametrical direction of the circular or oval crucible.

When the linear crucible is fed by the feeding device, the bottle holder 3 holds the material bottle 5 and rotates to tilt the material bottle 5 and align the bottle mouth with the linear crucible 4 to pour material into the linear crucible 4. At the same time, the robot arm 2 moves linearly on the base parallel to the lengthwise direction of the linear crucible 4 to make the material bottle 5 move linearly parallel to the lengthwise direction of the linear crucible 4 directly above the linear crucible 4, so that the material in the bottle 5 is poured evenly in the linear crucible 4.

While the robot arm 2 moves linearly, the bottle holder 3 will rotate at the other end of the robot arm 2 to rotate the bottle mouth of the material bottle 5 downwards, so that the material in the bottle 5 can be poured into the linear crucible 4 continuously.

Optionally, the feeding device may further include a control module (not shown in the figures). The control module may be disposed on the base 1, the robot arm 2 or the bottle holder 3 for controlling the rotation speed of the bottle holder 3 during the linear motion of the robot arm 2.

Wherein, during the linear movement of the robot arm 2, the magnitude $V_\theta$ of the angular velocity of the rotation of the bottle holder 3 controlled by the control module may be:

$$V_\theta = d\theta/dt = V_g m/\rho L \cdot d\theta/dv2 \qquad (1);$$

In the above formula (1), $V_g$ is the translation speed of the robot arm 2 and robot arm 2 moves at a constant speed; in is the mass of the required material, $\rho$ is the density of the required material, L is the length of the linear crucible 4, where L may be the length of one linear crucible 4 or the length of a plurality of linear crucibles 4 in series, $d\theta/dv2$ is the relationship between the volume of the material poured out from the material bottle 5 and the tilt angle of the material bottle, which is measured in advance.

Preferably, referring to FIG. 1, the base 1 is provided with a translational track 11, the lengthwise direction of the translational track 11 is parallel to the lengthwise direction of the linear crucible 4; one end of the robot arm 2 is located in the translational track 11 and can slide in the translational track 11.

Since the lengthwise direction of the translational track 11 is parallel to the lengthwise direction of the linear crucible 4, the robot arm 2 can slide in the translational track 11, which ensures that the robot arm 2 can moves linearly parallel to the lengthwise direction of the linear crucible 4.

Optionally, referring to FIG. 1, the robot arm 2 includes an upper robot arm 21, a lower robot arm 22 and a first rotary member 23.

One end of the lower robot arm 22 is movably connected with the base 1, and the other end is hinged with one end of the upper robot arm 21 via the first rotary member 23; the bottle holder 3 is arranged at the other end of the upper robot arm 21.

Optionally, one end of the lower robot arm 22 may be located in the translational track 11 provided in the base 1, and the one end of the lower robot arm 22 may move linearly in the translational track 11 parallel to the lengthwise direction of the linear crucible 4. The bottle holder 3 can rotate at the other end of the upper robot arm 21.

Since the lower robot arm 22 is hinged with the upper robot arm 21 via the first rotary member 23, the upper robot arm 21 can be rotated relative to the lower robot arm 22, so that by controlling the first rotary member 23 to rotate the upper arm 21, the bottle mouth of the material bottle 5 held by the bottle holder 3 can be located directly above the linear crucible 4.

Optionally, the first rotary member 23 may be a rotary shaft.

Optionally, referring to FIG. 1, the robot arm 2 further includes a slide member 24 and a second rotary member 25.

The slide member 24 is movably connected to the base 1. One end of the lower robot arm 22 is hinged with the slide member 24 by the second rotary member 25.

Because the lower robot arm 22 is hinged with the slide member 24 by the second rotary member 25, the lower robot arm 22 can be rotated relative to the slide member 24 so that the bottle mouth of the material bottle 5 held by the bottle holder 3 can be more flexibly positioned directly above the linear crucible 4 by controlling the second rotary member 25 to rotate the lower robot arm 22 and controlling the first rotary member 23 to rotate the robot upper arm 21.

Optionally, the rotation angle $\theta_1$ of the lower robot arm 22 and the rotation angle $\theta_2$ of the upper robot arm 21 can be controlled by the control module so that the bottle mouth of the material bottle 5 held by the bottle holder 3 is positioned directly above the linear crucible 4. The rotation angle $\theta_1$ of the lower robot arm 22 is the angle between the lower robot arm 22 and the vertical direction. The rotation angle $\theta_2$ of the upper robot arm 21 is the angle between the upper robot arm 21 and the horizontal direction.

The positional relationship between the rotation angle $\theta_1$ of the lower robot arm 22 and the rotation angle $\theta_2$ of the upper robot arm 21 and the bottle mouth position $(x_0, y_0)$ of the material bottle 5 satisfies the relationship given by the following formula (2)

$$\begin{cases} x_0 = L_1 \cdot \sin\theta_1 + L_2 \cdot \cos\theta_2 \\ y_0 = L_1 \cdot \cos\theta_1 + L_2 \cdot \sin\theta_2 \end{cases} \quad (2)$$

In the above formula (2), $L_1$ is the length of the lower robot arm 22 and $L_2$ is the length of the upper robot arm 21.

Wherein, the bottle mouth position $(x_0, y_0)$ of the material bottle 5 satisfies the relationship given by the following formula (3):

$$\begin{cases} x_0 = (h-d)/\sin\theta + \cos\theta \cdot [C - (h-d)/\tan\theta] \\ y_0 = \sin\theta \cdot [(h-d)/\tan\theta - C] \end{cases} ; \quad (3)$$

In the above formula (3), C is the length of the bottle holder 3; h is the height of the material bottle 5; d is the distance from the clamping position at which the material bottle 5 is held by the bottle holder 3 to the bottom of the material bottle 5; θ is the tilt angle of the material bottle 5, that is, the angle between the longitudinal axis of the material bottle 5 and the vertical direction.

It can be seen from the above formulas (2) and (3) that the position of the bottle mouth of the material bottle 5 is continuously changed due to continuous rotation of the material bottle 5 during the feeding process. So the control module needs to obtain the tilt angle of the material bottle 5 in real time and calculate the bottle mouth position $(x_0, y_0)$ of the material bottle 5 according to the tilt angle of the material bottle 5 by the above formula (3); then, the rotation angle $\theta_1$ of the lower robot arm 22 and the rotation angle $\theta_2$ of the upper robot arm 21 are calculated based on the above formula (2), and the first rotary member 23 and the second rotary member 25 are controlled to rotate the upper robot arm 21 and the lower robot arm 22 according to the rotation angle $\theta_1$ of the lower robot arm 22 and the rotation angle $\theta_2$ of the upper robot arm 21 so that the bottle mouth of the material bottle 5 is always positioned directly above the linear crucible 4.

Optionally, an angle measurement module (not shown) may be disposed on the bottle holder 3, and the angle measurement module can measure the tilt angle θ of the material bottle 5 in real time and send the tilt angle θ to the control module. Alternatively, the control module may calculate the tilt angle θ of the material bottle 5 in real time according to the rotation speed $V_\theta$ of the bottle holder 3 and the movement time of the robot arm 2.

Optionally, the angle measurement module may be a gravity sensor, an angular velocity sensor or a gyroscope.

Optionally, the slide member 24 may be disposed in the translational track 11 provided in the base 1, and the slide member 24 may move linearly in the translational track 11 parallel to the lengthwise direction of the linear crucible 4.

Optionally, the second rotary member 25 may be a rotary shaft.

The structure of the slide member 24 is various, and a detailed example of the slide member 24 will be given in this embodiment.

Figure 2:
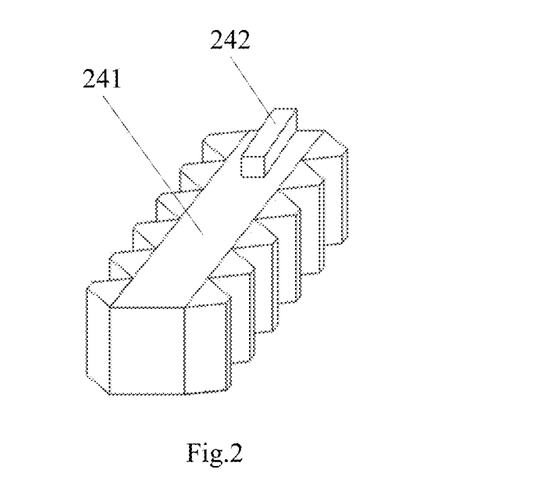
FIG. 2 is a schematic structural view of a slide member of a feeding device according to an embodiment of the present disclosure.

For example, referring to FIG. 2, the slide member 24 may include a rack 241 and a connecting portion 242. The connecting portion 242 is fixed to one end of the rack 241, and the connecting portion 242 is hinged with the lower robot arm 22 through the second rotary member 25. Optionally, the connecting portion 242 and the rack 241 may be integrally formed or the connecting portion 242 may be welded on the rack 241.

Figure 3:
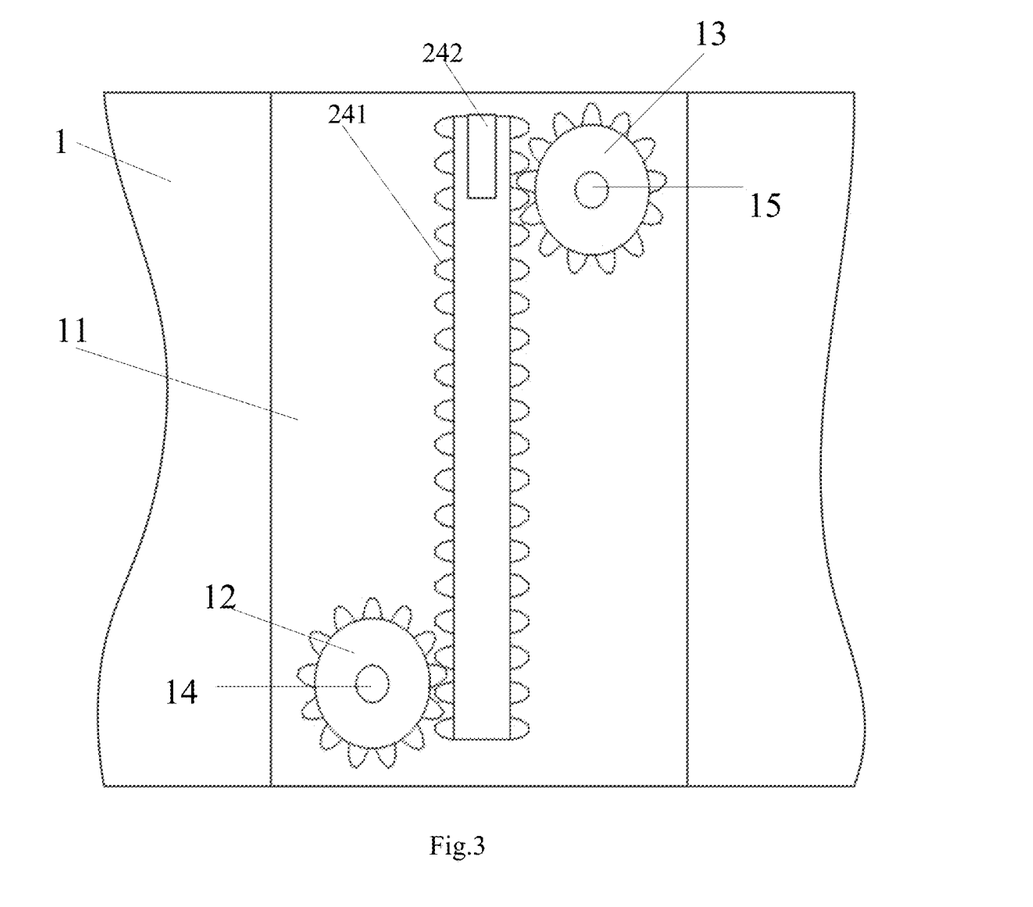
FIG. 3 is a schematic structural view of a slide member and a smooth track of a feeding device according to an embodiment of the present disclosure.

Correspondingly, referring to FIG. 3, the rack 241 is located in the translational track 11 of the base 1; a first gear 12 and a second gear 13 may also be disposed in the translational track 11; the first gear 12 and the second gear 13 may be located at either side of the rack 241 and meshed with the rack 241.

Optionally, a first rotary shaft 14 and a second rotary shaft 15 may be fixed on the bottom surface of the translational track 11. The first gear 12 is mounted on the first rotary shaft 14 and rotates about the first rotary shaft 14. The second gear 13 is mounted on the second rotary shaft 15 and rotates around the second rotary shaft 15. When the first gear 12 and the second gear 13 rotate, the rack 241 can be driven to linearly move in the translational track 11, so as to move the robot arm 2 linearly in the translational track 11.

Optionally, referring to FIG. 1, the feeding device further includes a third rotary member 31. The bottle holder 3 is disposed at the other end of the upper robot arm 21 through the third rotary member 31. The control module can rotate the bottle holder 3 at the other end of the upper robot arm 21 by controlling the third rotary member 31.

Figure 4:
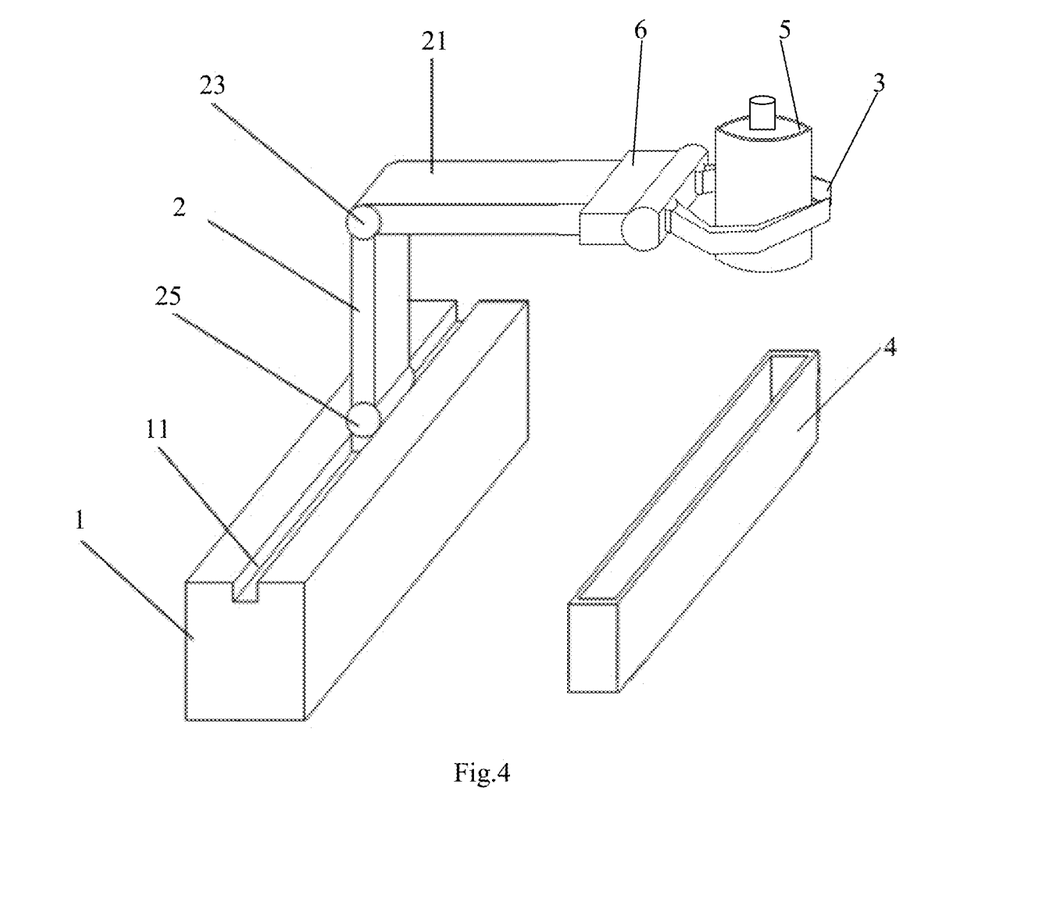
FIG. 4 is a schematic structural view of another feeding device for a crucible according to an embodiment of the present disclosure.

Optionally, referring to FIG. 4, the feeding device further includes: a first vibration unit 6;

The first vibration unit 6 is fixed at the other end of the robot arm 2, and the bottle holder 3 is disposed on the first vibration unit 6.

Optionally, the first vibration unit 6 may be fixed at the other end of the upper robot arm 21. During the linear movement of the robot arm 2 parallel to the lengthwise direction of the linear crucible 4, the first vibration unit 6 can vibrate and cause the material bottle 5 held by the bottle holder 3 to vibrate together, so that the granular material or viscous material in the material bottle 5 can be evenly poured into the linear crucible 4.

Optionally, the first vibration unit 6 may be a vibrator or the like.

Figure 5:
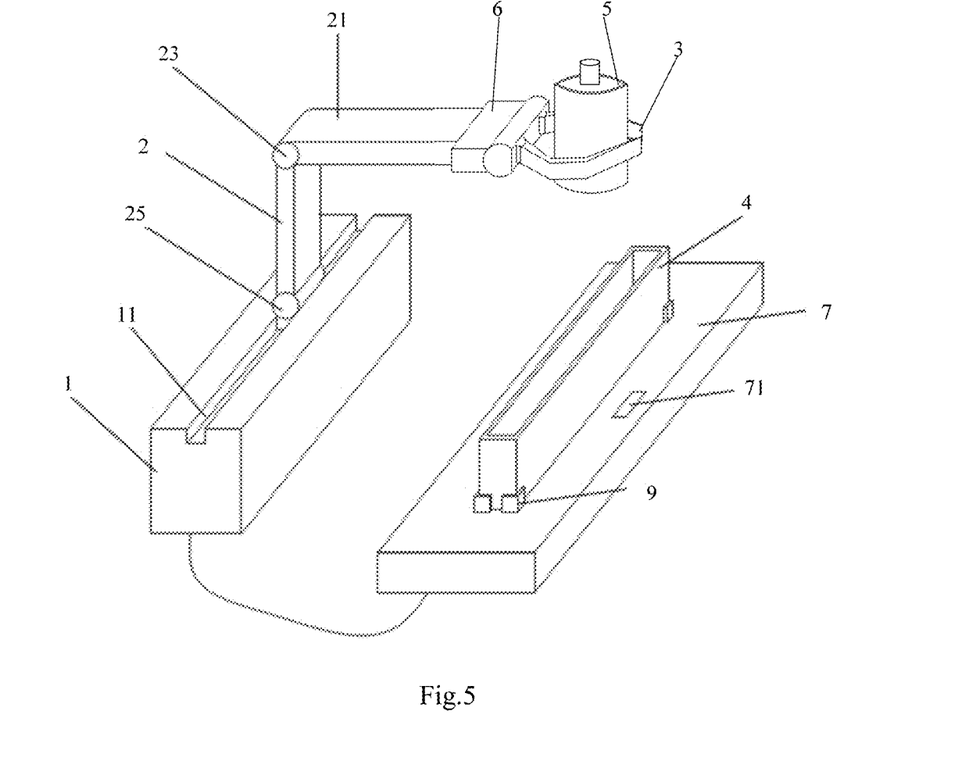
FIG. 5 is a schematic structural view of another feeding device for a crucible according to an embodiment of the present disclosure.

Optionally, referring to FIG. 5, the feeding device may further include a weighing part 7 on which the linear crucible 4 is placed.

Optionally, the weighing part 7 is also provided with a weight display 71. The current weight of the material in the source crucible 4 can be measured in real time through the weighing part 7 and displayed on the weight display 71 so that a technician can see the current weight of the material in the linear crucible 4 in real time.

Optionally, the weighing part 7 may be an electronic scale.

Figure 6:
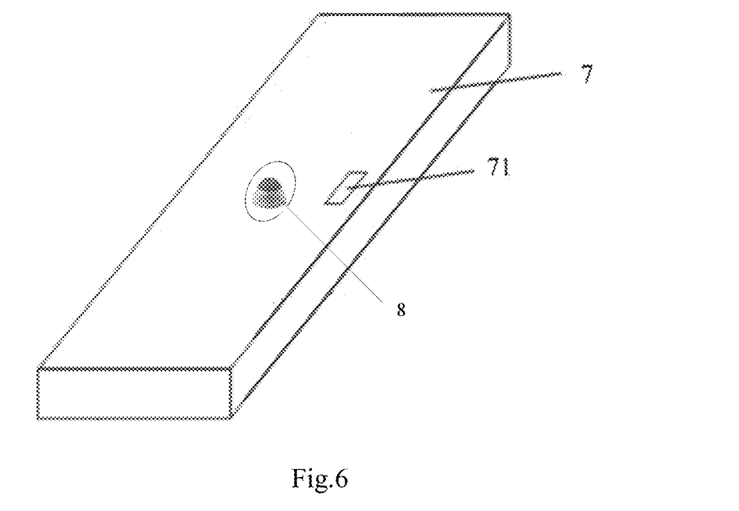
FIG. 6 is a schematic structural view of a weighing part of a feeding device according to an embodiment of the present disclosure.

Optionally, referring to FIG. 6, the feeding device further includes: a second vibration unit 8 disposed in the weighing part 7 and located under the linear crucible 4.

Referring to FIG. 6, a mounting hole is provided in the weighing part 7 under the linear crucible 4, and the second vibration unit 8 may be installed in the mounting hole.

Optionally, the second vibration unit 8 may be a vibrator or the like.

When the feeding of material into the crucible 4 is stopped, the second vibration unit 8 can be controlled to vibrate so that the linear crucible 4 located above the second vibration unit 8 is vibrated to make the material in the linear crucible 4 become homogeneous.

Optionally, the weighing part 7 is connected to the base 1.

The control module may be located in the base 1, the weighing part 7 may be connected with the control module through a connecting wire, and the control module may control the weighing part 7 to weigh the material in the linear crucible 4 to obtain the material weight and the obtained weight of the material is displayed on the weight display 71.

When the feeding of material into the crucible 4 is stopped, the control module may also control the second vibration unit 8 to vibrate to make the material in the linear crucible 4 become homogeneous.

Optionally, referring to FIG. 5, the feeding device further includes a fixing mechanism 9 disposed on the weighing part 7 for fixing the linear crucible 4 to the weighing part 7.

Optionally, the fixing mechanism 9 may include four fixing pieces, and the four fixing pieces fix the four corners of the linear crucible 4 on the weighing part 7.

Optionally, in the embodiment, one or more linear crucibles 4 may be used, and when more than one linear crucibles 4 is used, the plurality of linear crucibles 4 may be connected in series.

Optionally, when the control module controls the material bottle 5 to rotate to be just vertical, it means that all the materials in the material bottle 5 are added into the linear crucible 4, and the material bottle 5 is an empty bottle. At this time, if the material added to the linear crucible 4 is still insufficient, the control module may prompt to replace the material bottle 5.

In the embodiment of the present disclosure, since the robot arm can move linearly parallel to the length of the linear crucible, the material bottle held on the bottle holder can be linearly moved by the robot arm along the lengthwise direction of the linear crucible, and the bottle holder is rotatable and can rotate the material bottle, so as to pour the material in the material bottle into the crucible gradually, thereby to automatically add material into the linear crucible, without requiring the operator to manually add material, thereby protecting the operator's health and improving production efficiency. In addition, automatic addition of material is not easy to sprinkle the material outside the linear crucible so as to avoid waste and reduce production costs.

The above is only preferred embodiments of the present disclosure and is not intended to limit the present disclosure. Any modifications, equivalent substitutions, improvements, etc. within the spirit and principle of the disclosure should be included in the protection scope of the present disclosure. For example, although the principle and structure of the present invention are illustrated by taking the source crucible as an example, the scope of the present application is not limited to a linear crucible. For other shapes of crucible types, the same applies. For example, for circular or oval crucibles, the objects and technical effects of the present application are also achieved as long as the robot arm moves the bottle holder linearly along the long axis or the diametrical direction of the circular or oval crucible.

The invention claimed is:

1. A feeding device for a crucible, the feeding device comprising: a base; a robot arm; and a bottle holder, wherein the base is movably connected to a first end of the robot arm adjacent to the base, the first end of the robot arm is configured to only move linearly on the base, a direction of the linear movement of the first end of the robot arm on the base is parallel to a lengthwise direction of the crucible and parallel to the ground, wherein the bottle holder is disposed at a second end of the robot arm away from the base and the bottle holder is configured to be rotatable at the second end of the robot arm, wherein said base is provided with a groove-shaped translational track whose lengthwise direction is parallel to the lengthwise direction of said crucible and the direction of the linear movement, the first end of the robot arm is configured to be slidable in the translational track, and wherein the feeding device further comprises a control module disposed on one of the base, the robot arm and the bottle holder for controlling an angular velocity $V_\theta$ of rotation of the bottle holder during the linear movement of the first end of the robot arm, a magnitude of the angular velocity $V_\theta$ s satisfies a formula of:

$$V_\theta = d\theta/dt = V_g m/\rho L \cdot d\theta/dv2 \qquad (1),$$

in the formula (1), $\theta$ is a tilt angle of the bottle, t is time, Vg is a translation speed of the first end of the robot arm, m is a mass of a material in the bottle, $\rho$ is a density of the material in the bottle, L is a length of the crucible, $d\theta/dv2$ is a relationship between a volume of the material poured out from the bottle and the tilt angle of the bottle, which is measured in advance.

2. The feeding device according to claim 1, wherein said robot arm includes an upper robot arm, a lower robot arm, and a first rotary member;

one end of the lower robot arm is movably connected to the base, and the other end of the lower robot arm is hinged with one end of the upper robot arm via the first rotary member; and the bottle holder is arranged at the other end of the upper robot arm.

3. The feeding device according to claim 2, further comprising a slide member and a second rotary member, the slide member is movably connected with the base;

one end of the lower robot arm is hinged with the slide member by the second rotary member.

4. The feeding device according to claim 3, further comprising: a third rotary member, the bottle holder is provided at thereof the upper robot arm by the third rotary member.

5. The feeding device according to claim 3, further comprising a first vibration unit, wherein the first vibration unit is fixed at the second robot arm, and the bottle holder is disposed on the first vibration unit.

6. The feeding device according to claim 2, further comprising: a third rotary member, the bottle holder is provided at the second end of the upper robot arm by the third rotary member.

7. The feeding device according to claim 2, further comprising a first vibration unit, wherein the first vibration unit is fixed at the second of the robot arm, and the bottle holder is disposed on the first vibration unit.

8. The feeding device according to claim 1, further comprising a first vibration unit, wherein the first vibration unit is fixed at the second of the robot arm, and the bottle holder is disposed on the first vibration unit.

9. The feeding device according to claim 8, further comprising a weighing part on which the crucible is placed.

10. The feeding device according to claim 9, wherein the weighing part is provided with a weight display.

11. The feeding device according to claim 9, wherein said weighing part is an electronic scale.

12. The feeding device according to claim 9, further comprising a second vibration unit provided in the weighing part and under the crucible.

13. The feeding device according to claim 9, wherein the weighing part is connected to the base.

14. The feeding device according to claim 13, further comprising a fixing mechanism provided on the weighing part for fixing the crucible to the weighing part.

15. The feeding device according to claim 1, wherein the crucible is a linear crucible.

16. A manufacturing apparatus of a display substrate comprising the feeding device according to claim 1.

* * * * *